(12) United States Patent
Seidler et al.

(10) Patent No.: US 10,985,549 B2
(45) Date of Patent: Apr. 20, 2021

(54) FAULT CURRENT PROTECTION DEVICE FOR MONITORING AN ELECTRIC LOAD FOR A VEHICLE, AND METHOD FOR CARRYING OUT A SELF-TEST OF A FAULT CURRENT SENSOR

(71) Applicant: JENOPTIK Advanced Systems GmbH, Wedel (DE)

(72) Inventors: Klaus Seidler, Uetersen (DE); Michael Meier, Braak (DE)

(73) Assignee: Jenoptik Advanced Systems GmbH, Wedel (DE)

( * ) Notice: Subject to any disclaimer, the term of this patent is extended or adjusted under 35 U.S.C. 154(b) by 408 days.

(21) Appl. No.: 15/767,026

(22) PCT Filed: Sep. 9, 2016

(86) PCT No.: PCT/EP2016/071282
§ 371 (c)(1),
(2) Date: Apr. 9, 2018

(87) PCT Pub. No.: WO2017/060035
PCT Pub. Date: Apr. 13, 2017

(65) Prior Publication Data
US 2018/0299499 A1 Oct. 18, 2018

(30) Foreign Application Priority Data
Oct. 7, 2015 (DE) .................... 10 2015 012 923.6

(51) Int. Cl.
*H02H 3/33* (2006.01)
*H02H 1/00* (2006.01)
*G01R 31/00* (2006.01)

(52) U.S. Cl.
CPC .......... *H02H 3/335* (2013.01); *H02H 1/0076* (2013.01); *G01R 31/005* (2013.01)

(58) Field of Classification Search
CPC ...... H02H 3/335; H02H 3/044; H02H 1/0076; G01R 31/2827; G01R 31/005
See application file for complete search history.

(56) References Cited

U.S. PATENT DOCUMENTS

| 6,421,214 B1 | 7/2002 | Packard et al. |
| 2006/0119368 A1 | 6/2006 | Sela et al. |

(Continued)

FOREIGN PATENT DOCUMENTS

| DE | 10 2008 033 148 A1 | 2/2010 |
| DE | 10 2011 084 362 B4 | 3/2015 |

(Continued)

OTHER PUBLICATIONS

International Search Report: PCT/EP2016/071282 dated Dec. 12, 2016.

(Continued)

*Primary Examiner* — Fred E Finch, III
(74) *Attorney, Agent, or Firm* — Muncy, Geissler, Olds & Lowe, P.C.

(57) ABSTRACT

A residual current sensor for a residual current protective device for monitoring an electrical load for a vehicle is presented. The residual current sensor has an electrical circuit for identifying a test signal in an electrical forward conductor, which forward-conducts from a control apparatus for controlling the electrical load to the electrical load the test signal represents a request to perform a self-test of the residual current sensor. The residual current sensor also has a residual-current-generating apparatus for generating a test residual current in an electrical reverse conductor, which conducts away from the electrical load, in response to the identified test signal. The residual current sensor furthermore has a measuring apparatus for measuring a differential current between a first electric current in the electrical (Continued)

forward conductor and a second electric current in the electrical reverse conductor.

15 Claims, 4 Drawing Sheets

(56) References Cited

U.S. PATENT DOCUMENTS

| | | | | |
|---|---|---|---|---|
| 2011/0216453 | A1* | 9/2011 | Haines | H02H 9/00 |
| | | | | 361/49 |
| 2012/0249070 | A1 | 10/2012 | Sellner et al. | |
| 2013/0300429 | A1* | 11/2013 | Jefferies | B60L 53/16 |
| | | | | 324/511 |
| 2014/0118158 | A1* | 5/2014 | Parra | H04B 3/54 |
| | | | | 340/854.9 |
| 2014/0254050 | A1* | 9/2014 | Haines | H02H 3/162 |
| | | | | 361/42 |

FOREIGN PATENT DOCUMENTS

| | | | |
|---|---|---|---|
| WO | WO 99/39417 | A1 | 8/1999 |
| WO | WO 2014/204488 | A1 | 12/2014 |

OTHER PUBLICATIONS

International Preliminary Report on Patentability: PCT/EP2016/071282 dated Apr. 19, 2018.
"Controller Area Network"; Wikipedia. Wikipedia online; https://de.wikipedia.org/wiki/Controller_Area_Network pp. 1-29 with Englsih translation (2015).

* cited by examiner

FAULT CURRENT PROTECTION DEVICE FOR MONITORING AN ELECTRIC LOAD FOR A VEHICLE, AND METHOD FOR CARRYING OUT A SELF-TEST OF A FAULT CURRENT SENSOR

This nonprovisional application is a National Stage of International Application No. PCT/EP2016/071282, which was filed on Sep. 9, 2016, and which claims priority to German Patent Application No. 10 2015 012 923.6, which was filed in Germany on Oct. 7, 2015, and which are both herein incorporated by reference.

BACKGROUND OF THE INVENTION

Field of the Invention

The present invention relates to a residual current sensor for a residual current protective device for monitoring an electrical load for a vehicle, to a residual current protective device for monitoring an electrical load for a vehicle, to a method for performing a self-test of a residual current sensor for a residual current protective device for monitoring an electrical load for a vehicle and to a corresponding computer program product.

Description of the Background Art

A residual current sensor can be fitted, for example, with additional control and signal lines for the purpose of actuation and for the purpose of feeding back a fault signal. A self-test of a residual current sensor can be initiated, in particular, manually by means of a switch or by means of a signal line. In this case, the test can be initiated by means of additional signal lines.

DE 10 2008 033 148 A1 relates to a residual current protective device and to a method for performing a self-test by way of a residual current protective device.

SUMMARY OF THE INVENTION

It is therefore an object of the present invention to provide a residual current sensor for a residual current protective device for monitoring an electrical load for a vehicle, a residual current protective device for monitoring an electrical load for a vehicle, a method for performing a self-test of a residual current sensor for a residual current protective device for monitoring an electrical load for a vehicle and a corresponding computer program product, as claimed in the main claims. Advantageous refinements emerge from the respective subclaims and the following description.

In accordance with embodiments of the present invention, in the case of a remote residual current sensor for a controller of an electrical load, wherein current return lines via grounded structures can be used, for example, a test can be initiated by means of a test signal transmitted on a current forward conduction line. In this case, the residual current sensor can be configured to intentionally generate a residual current in response to the test signal transmitted via the current forward conduction line for testing purposes. This residual current generated for testing purposes can then be detected by means of the residual current sensor and can be signaled to the controller via the current forward conduction line.

In other words, in the case of a remote residual current sensor, for example for a heater controller for use in aircraft or in the case of a heater controller having a remote residual current sensor for use in aircraft, in addition to a circuit-based solution for monitoring an electrical load for the occurrence of a residual current by observing or taking into account current feedback via a grounded structure or via busbars, a functional state and if appropriate a functional failure of the residual current sensor can be identified.

In accordance with embodiments of the present invention, a self-test of a remote residual current sensor can advantageously be initiated by means of a signal transmitted via a current forward conduction line, in particular by means of a modulation of the supply voltage, such that it is possible to dispense with additional signal or control lines for triggering the self-test. In other words, a functional test of the residual current detection system can therefore be carried out in a remote residual current sensor by way of a test being initiated, in particular, by means of supply voltage modulation. Such a test function can expand the functional scope of the controller by the monitoring of a residual current arising in a connected load and can make it possible to check the function of the remote residual current sensor without additional wiring outlay and interface outlay.

The proposed residual current sensor can represent a simple, robust and cost-effective circuit, which can be installed upstream of a component to be protected, in particular a heated component, without additional wiring, and can for example be checked regularly for correct operation. It is therefore possible to achieve residual current protection and self-testing while avoiding additional wiring outlay, which, in particular, can also make a weight saving that is advantageous with respect to economic considerations possible in aircraft.

A residual current sensor for a residual current protective device for monitoring an electrical load for a vehicle is presented, wherein the residual current sensor has the following features:

an electrical circuit for identifying a test signal in an electrical forward conductor, which represents a conductor that forward-conducts from a control apparatus for controlling the electrical load to the electrical load, wherein the test signal represents a request to perform a self-test of the residual current sensor;

a residual-current-generating apparatus for generating a test residual current in an electrical reverse conductor, which conducts away from the electrical load, in response to the identified test signal;

a measuring apparatus for measuring a differential current between a first electric current in the electrical forward conductor and a second electric current in the electrical reverse conductor; and a signaling apparatus for signaling at least the test residual current to the control apparatus via the forward conductor depending on a comparison of the measured differential current with a threshold value.

The residual current protective device can be referred to as what is known as an Fl switch or a residual current circuit breaker. The residual current sensor and the control apparatus can be parts of the residual current protective device. The residual current sensor, as well as the residual current protective device, can be used here, in particular, in a motor vehicle, for example in an aircraft. The electrical load can be embodied, for example, as a heater or another load. The residual current sensor can be electrically connected between the control apparatus and the electrical load. The residual current protective device can also be configured or provided, for example, for monitoring a plurality of electrical loads. The residual current sensor can be in a self-test mode from a time of identifying the test signal up to a time of signaling at least the test residual current. The test signal can therefore constitute a trigger, in response to which the residual current sensor can perform the self-test.

In accordance with one embodiment, the electrical circuit can be configured to identify a modulation of a voltage on the forward conductor by the control device as the test signal. In this case, the modulation can have a modulation pattern and, additionally or alternatively, another modulation property, which, for the electrical circuit, can be identified as the test signal. An embodiment of this kind offers the advantage that an additional line for the test signal is not required and the test signal can be transmitted and identified in a simple and reliable manner.

Furthermore, the residual-current-generating apparatus can have a residual current switch for connecting an electrical resistor for residual current generation. In this case, the electrical resistor can be electrically conductively connected to the reverse conductor. In this case, the residual current switch can be configured, in a closed switching position, to electrically conductively connect the electrical resistor to the forward conductor. In other words, the residual current switch and the electrical resistor can be configured to generate the test residual current. An embodiment of this kind offers the advantage that a test residual current for a functional test or self-test of the residual current sensor can be produced in a simple and reliable manner.

In addition, the signaling apparatus can be configured to signal the test residual current and, additionally or alternatively, a residual current produced by the electrical load to the control apparatus using current amplitude modulation on the forward conductor. In this case, the measuring apparatus can be configured to measure a differential current, which is produced by the test residual current and, additionally or alternatively, a residual current produced by the electrical load. In a normal operating mode of the residual current sensor, the measuring apparatus can be configured to measure a differential current, which is produced by a residual current produced by the electrical load, wherein the signaling apparatus can be configured to signal the residual current produced by the electrical load to the control apparatus on the forward conductor. In a self-test mode of the residual current sensor, the measuring apparatus can be configured to measure a differential current, which is produced by the test residual current, wherein the signaling apparatus can be configured to signal the test residual current to the control apparatus on the forward conductor. An embodiment of this kind offers the advantage that a present residual current and, additionally or alternatively, a correctly detected test residual current can be reported in a simple, reliable and uncomplicated manner.

The signaling apparatus can also have a switch for connecting a defined load. In this case, the defined load can be electrically conductively connected to the reverse conductor. The switch can be configured, in a closed switching position, to electrically conductively connect the defined load to the forward conductor. The load can therefore remain switched on. A resulting summation current from a load current and a current of the defined load can be above a range that represents a supply current range of the electrical load and said current can be interpreted by the control apparatus as an occurrence of an identified residual current. An embodiment of this kind offers the advantage that the occurrence of a residual current can be signaled in a reliable and uncomplicated manner.

In accordance with one embodiment, the electrical circuit can be configured to carry out the comparison of the measured differential current with the threshold value. The electrical circuit can optionally also be configured to execute further functions for the residual current sensor. An embodiment of this kind offers the advantage that it is possible to identify whether the occurrence of a residual current is present in a quick and reliable manner.

A residual current protective device for monitoring an electrical load for a vehicle is also presented, wherein the residual current protective device has the following features: an embodiment of the aforementioned residual current sensor; and a control apparatus for controlling the electrical load, wherein the control apparatus and the residual current sensor can be or are electrically conductively connected to one another at least by means of the forward conductor.

One embodiment of the aforementioned residual current sensor can advantageously be used in connection with the residual current protective device to identify or to detect a residual current with respect to the electrical load and to make a self-test of the residual current sensor possible. The control apparatus can additionally be configured to interrupt a flow of electric current through the electrical load depending on a signaled residual current.

In accordance with one embodiment, the control apparatus can be configured to transmit the test signal to the residual current sensor via the electrical forward conductor. In this case, the control apparatus can be configured to moderate a voltage of the electrical forward conductor. An embodiment of this kind offers the advantage that a self-test of the residual current sensor can therefore be produced in a cost-effective, space-saving and reliable manner.

In particular, the control apparatus and the residual current sensor can be housed separately from one another. In this case, the residual current sensor can be arranged outside of a housing of the control apparatus. In other words, a housing of the control apparatus and a housing of the residual current sensor can be arranged separately from one another. An embodiment of this kind offers the advantage that, in particular, a residual current with respect to the electrical load can also be reliably identified in the case of current feedback from the electrical load in a partial section via a grounded component.

The residual current sensor can also have a forward conductor input connection for connection to a control-apparatus-side section of the forward conductor, a forward conductor output connection for connection to a load-side section of the forward conductor, a reverse conductor input connection for connection to a load-side section of the reverse conductor and a reverse conductor output connection for connection to a structure-side section of the reverse conductor. The control-apparatus-side section of the forward conductor represents a subsection of the forward conductor, by means of which the residual current sensor and the control apparatus can be or are electrically conductively connected to one another. The load-side section of the forward conductor represents a subsection of the forward conductor, by means of which the residual current sensor and the electrical load can be or are electrically conductively connected to one another. The load-side section of the reverse conductor represents a subsection of the reverse conductor, by means of which the residual current sensor and the electrical load can be or are electrically conductively connected to one another. The structure-side section of the reverse conductor represents a subsection of the reverse conductor, by means of which the residual current sensor can be or is connected to the control apparatus by means of a structure element of the vehicle. An embodiment of this kind offers the advantage that the residual current sensor can be arranged remotely from the control apparatus in a simple and uncomplicated manner.

In this case, the control-apparatus-side section of the forward conductor can be at least as long as the load-side section of the forward conductor. The residual current sensor can therefore be spaced apart at a greater distance from the control apparatus than from the electrical load. An embodiment of this kind offers the advantage that a residual current can also be determined in the case of current feedback via a grounded vehicle structure in a manner that is reliable and close to the load.

In particular, the control apparatus can have at least one output connection for connection to the control-apparatus-side section of the forward conductor and an input connection for connection to a further structure-side section of the reverse conductor. In this case, it is possible that the further structure-side section and the structure-side section of the reverse conductor can be or are electrically conductively connected to one another by means of a structure element of the vehicle. In this case, the structure element can be grounded and formed from any electrical material. The control apparatus can also have further connections for connection to an electrical voltage source or current source. An embodiment of this kind offers the advantage that a space-saving and weight-saving realization of the residual current protective device and of the interconnection or wiring of the same and of the electrical load can be made possible.

A method for performing a self-test of a residual current sensor for a residual current protective device for monitoring an electrical load for a vehicle is furthermore presented, wherein the method has the following steps: identifying a test signal in an electrical forward conductor, which forward-conducts from a control apparatus for controlling the electrical load to the electrical load, wherein the test signal represents a request to perform a self-test of the residual current sensor; generating a test residual current in an electrical reverse conductor, which conducts away from the electrical load, in response to the identified test signal; measuring a differential current between a first electric current in the electrical forward conductor and a second electric current in the electrical reverse conductor; and signaling at least the test residual current to the control apparatus via the forward conductor depending on a comparison of the measured differential current with a threshold value.

The method can advantageously be embodied in connection with or using an embodiment of the aforementioned residual current sensor or else an embodiment of the aforementioned residual current protective device.

An apparatus configured to carry out, trigger or implement the steps of a variant of a method presented here in corresponding devices is furthermore presented. The object on which the invention is based can also be achieved quickly and efficiently by this embodiment variant of the invention in the form of an apparatus.

The apparatus can be configured to read in input signals and to determine and supply output signals using the input signals. An input signal can constitute, for example, a sensor signal that can be read in by means of an input interface of the apparatus. An output signal can constitute a control signal or a data signal, which can be supplied at an output interface of the apparatus. The apparatus can be configured to determine the output signals using a processing rule implemented in hardware or software. For this purpose, the apparatus can comprise, for example, a logic circuit, an integrated circuit or a software module and can be realized, for example, as a discrete component or be comprised by a discrete component.

Also advantageous is a computer program product or computer program having program code that may be stored on a machine-readable carrier or storage medium such as a semiconductor memory, a hard disk memory or an optical storage unit. If the program product or program is executed on a computer or an apparatus, the program product or program can be used to carry out, implement and/or trigger the steps of the method in accordance with one of the embodiments described above.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Before exemplary embodiments are illustrated with reference to the figures, backgrounds of the exemplary embodiments are explained first. On-board electrical power supply systems, in particular in aircraft, are designed, for example, in such a way that a plurality of loads are supplied with power via a forward conductor or single-pole electrical connection and the returning current is conducted via a structure or vehicle structure and hence a separate return conductor for each load is spared. It is therefore possible, in a controller connected upstream, in particular with a remote residual current sensor, to identify a residual current arising in an electrical load as a differential current between the current in the forward conductor and in the reverse conductor.

Figure 1:
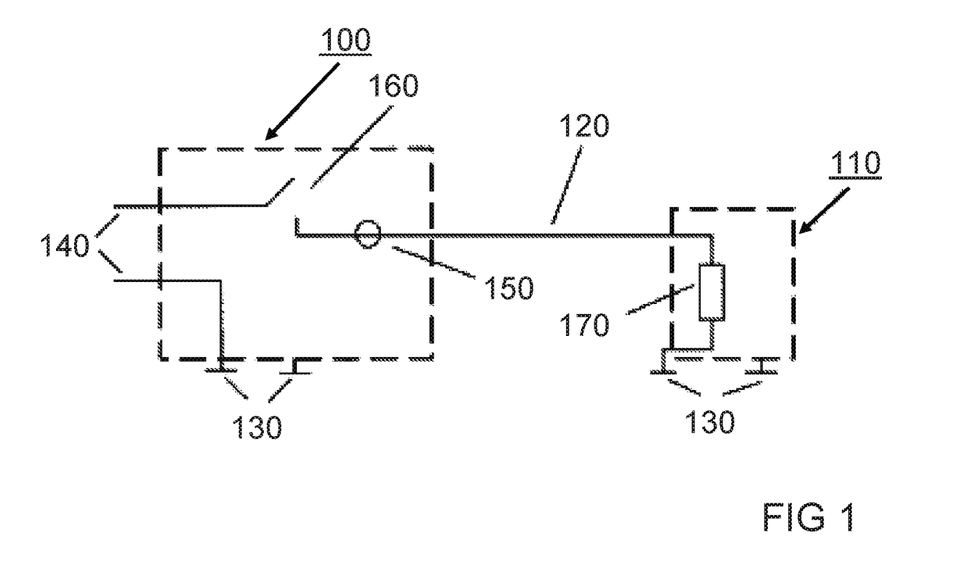
FIG. 1 shows a schematic illustration of a heater control apparatus and a heated component.

FIG. 1 shows a schematic illustration of a heater control apparatus 100 or a heater controller 100 and a heated component 110. Heater controllers 100 are used, for example, in airplanes for monitoring and driving heated components 110 in terms of power, such as floor panels and water pipes. In airplanes, an electrical connection between the heater controller 100 and the heated component 110 is usually effected in a single-pole manner by means of a forward conductor 120. The electric current is fed back from the heated component 110 to the heater controller 100 through a structure connection 130 or connection by means of a structure. Alternatively, it can also be fed back by means of busbars.

Here, both the heater controller 100 and the heated component 110 have at least one structure connection 130. In the illustration from FIG. 1, both the heater controller 100 and the heated component 110 each have two structure connections 130. The heater controller 100 furthermore has supply connections 140 for a supply voltage of the heater controller 100. In addition, the heater controller 100 has a current sensor 150 and an output switch 160. The heated component 110 has a heater 170, which represents an electrical load.

Figure 2:
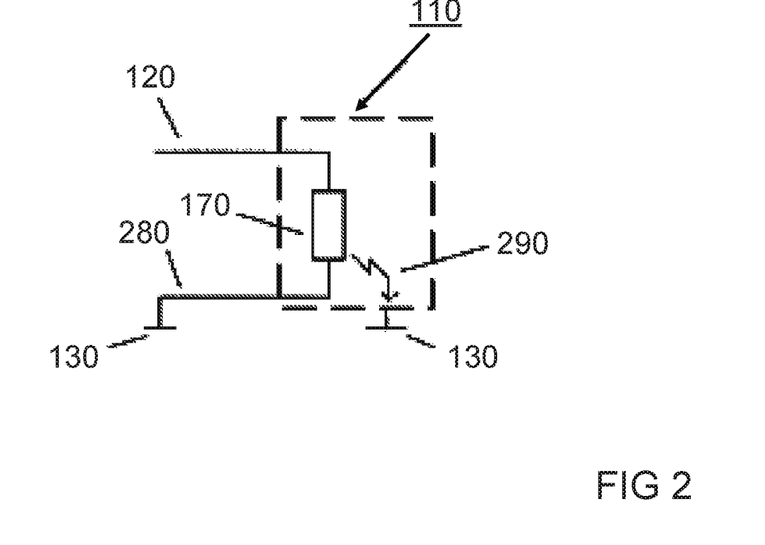
FIG. 2 shows a schematic illustration of the heated component from FIG. 1.

FIG. 2 shows a schematic illustration of the heated component 110 from FIG. 1. Shown here in FIG. 2 are the forward conductor 120 and, from the heated component 110, the structure connections 130, the heater 170, as well as a reverse conductor 280 and, symbolically, a residual current 290. The reverse conductor 280 extends here from the heater 170 to one of the structure connections 130.

In heated components 110, such as a heated floor panel, mechanical damage and/or ingress of liquids can lead to an insulation resistance decreasing and a residual current 290 arising between voltage-guiding parts of the heater part and a structure connected to the structure connections 130. Said residual current 290 leads to a current difference in the currents of the forward conductor 120 and the reverse conductor 280. Said generally low residual current 290 can possibly not be readily detected on account of the single-pole connection between the heater controller and the heated component 110 in the heater controller and can also possibly remain unidentified by an output current measurement using the current sensor in the heater controller.

Figure 3:
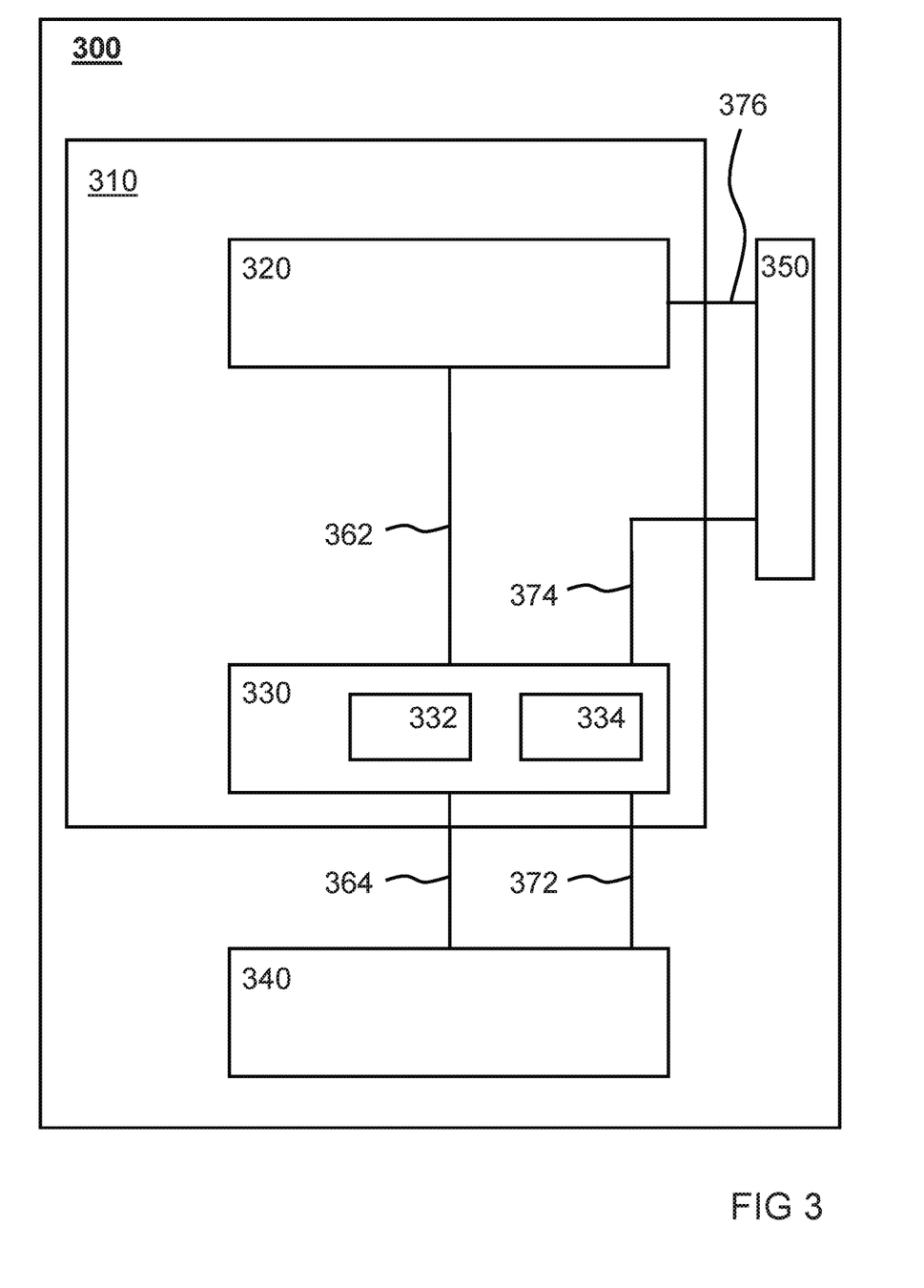
FIG. 3 shows a schematic illustration of a vehicle having a residual current protective device in accordance with an exemplary embodiment.

FIG. 3 shows a schematic illustration of a vehicle 300 having a residual current protective device 310 in accordance with an exemplary embodiment. The residual current protective device 310 is configured to monitor an electrical load of the vehicle 300 for a residual current.

The residual current protective device 310 has a control apparatus 320 and a residual current sensor 330 for this purpose. The vehicle 300 has the residual current protective device 310, an electrical load 340 and a grounded, electrically conductive structure 350 or a grounded, electrically conductive structure element 350 of the vehicle 300. The control apparatus 320 of the residual current protective device 310 is configured to control the electrical load 340. The residual current sensor 330 is electrically connected between the control apparatus 320 and the electrical load 340.

In accordance with the exemplary embodiment illustrated in FIG. 3, the control apparatus 320, the residual current sensor 330 and the electrical load 340 are electrically conductively connected to one another by means of an electrical forward conductor and an electrical reverse conductor. In this case, the electrical forward conductor has a control-apparatus-side section 362 between the control apparatus 320 and the residual current sensor 330 and a load-side section 364 between the residual current sensor 330 and the electrical load 340. The electrical reverse conductor has a load-side section 372 between the electrical load 340 and the residual current sensor 330, a structure-side section 374 between the residual current sensor 330 and the vehicle structure 350 and a further structure-side section 376 between the vehicle structure 350 and the control apparatus 320.

In accordance with the exemplary embodiment described and shown in FIG. 3, the electric current is therefore forward-conducted from the control apparatus 320 via the control-apparatus-side section 362 of the forward conductor, the residual current sensor 330 and the load-side section 364 of the forward conductor to the electrical load 340. The electric current is fed back here from the electrical load 340 via the load-side section 372 of the reverse conductor, the residual current sensor 330, the structure-side section 374 of the reverse conductor, the vehicle structure 350 and the further structure-side section 376 of the reverse conductor to the control apparatus 320. The vehicle structure 350 can be considered functionally as part of the electrical reverse conductor. Even though it is not explicitly illustrated in FIG. 3, at least the forward conductor can be embodied as a consistent electrical conductor.

In accordance with the exemplary embodiment illustrated in FIG. 3, a residual-current-generating apparatus 332 and an electrical circuit 334 of the residual current sensor 330 are shown. The residual current sensor 330 therefore has the residual-current-generating apparatus 332 and the electrical circuit 334. The residual current sensor 330 is explained in even greater detail below with reference to FIG. 4 and FIG. 5.

The electrical circuit 334 of the residual current sensor 330 is configured to identify a test signal, which is transmitted by the control apparatus 320 via the control-apparatus-side section 362 of the forward conductor. The test signal represents in this case a request to initiate and/or perform a self-test of the residual current sensor 330. In this case, the control apparatus 320 is configured to transmit the test signal to the residual current sensor 330 via the control-apparatus-side section 362 of the forward conductor. The residual-current-generating apparatus 332 of the residual current sensor 330 is configured to generate a test residual current, in response to the test signal identified by the electrical circuit 334. In this case, the residual-current-generating apparatus 332 is configured to generate the intentional test residual current in the reverse conductor 372, 374, 376, which conducts away from the electrical load 340.

In accordance with one exemplary embodiment, the electrical circuit 334 of the residual current sensor 330 is configured to identify a modulation of a voltage on the control-apparatus-side section 362 of the forward conductor as the test signal. In this case, the control apparatus 320 is configured to modulate the voltage on the control-apparatus-side section 362 of the forward conductor in order to transmit the test signal.

Figure 4:
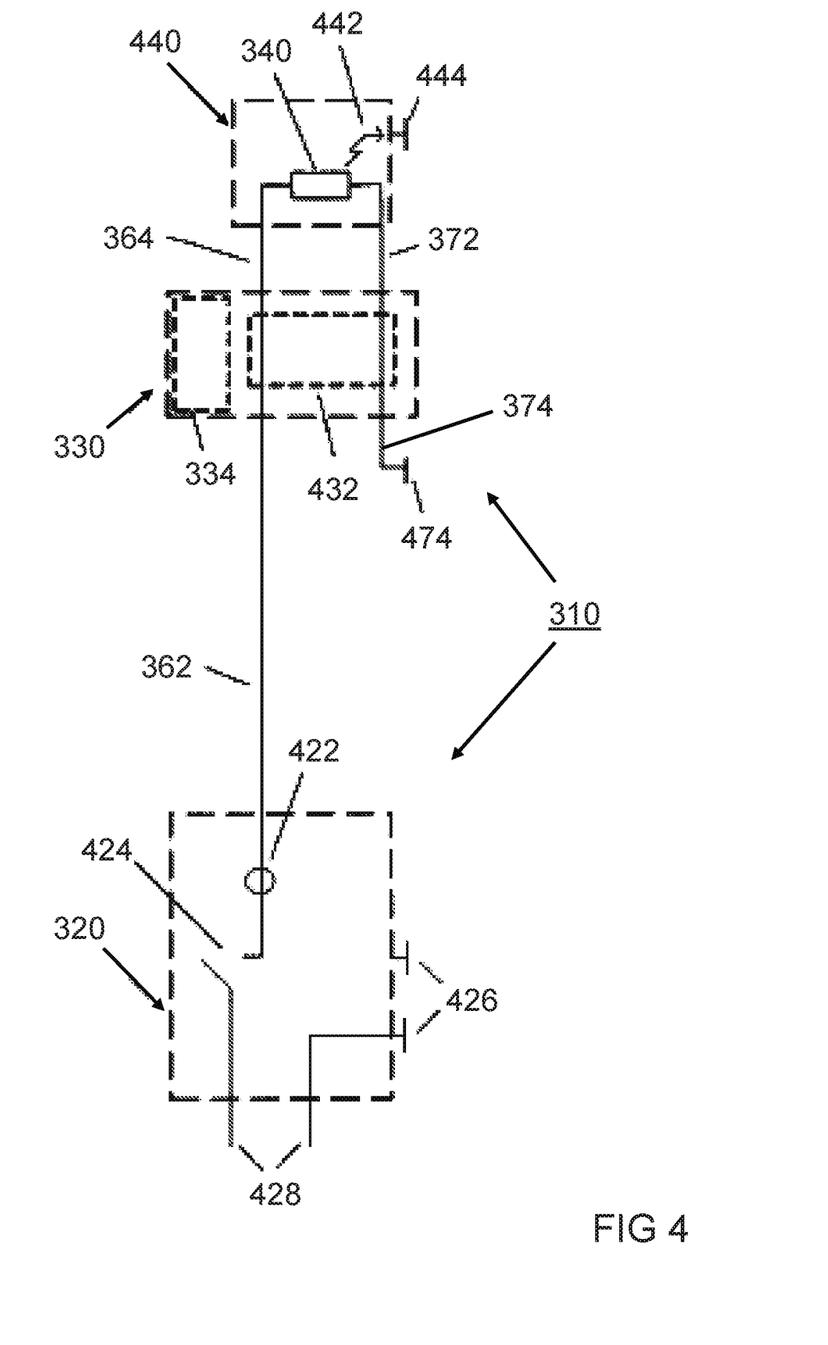
FIG. 4 shows a schematic illustration of a residual current protective device in accordance with an exemplary embodiment and of an electrical load for a vehicle.

FIG. 4 shows a schematic illustration of a residual current protective device 310 in accordance with an exemplary embodiment. Furthermore, an electrical load 340 for a vehicle is shown. The residual current protective device 310 is the residual current protective device from FIG. 3 or a similar residual current protective device. The residual current protective device 310 is therefore configured to monitor the electrical load 340. The residual current protective device 310 can be used in the vehicle from FIG. 3 or a similar vehicle. For example, the residual current protective device 310 is arranged in the vehicle from FIG. 3.

The illustration of the residual current protective device 310 in FIG. 4 corresponds in principle to the illustration of the residual current protective device from FIG. 3 with the exception of the fact that a current sensor 422, an output switch 424, structure connections 426 and supply connections 428 of the control apparatus 320 are further shown, that a measuring apparatus 432 of the residual current sensor 330 is further shown, that the electrical load 340 is embodied as a heater or heating element for a heated component 440, that a symbolically illustrated residual current 442 to a component structure connection 444 of the heated component 440 is shown and that a reverse conductor structure connection 474 is illustrated.

In accordance with the exemplary embodiment illustrated in FIG. 4, the measuring apparatus 432 and the electrical circuit 334 of the residual current sensor 330 are shown, said electrical circuit also being able to be referred to as electronics 334. The electrical circuit 334 in this case corresponds to the electrical circuit from FIG. 3, even when it is not explicitly shown in FIG. 4; the residual current sensor 330 therefore also has the residual-current-generating apparatus from FIG. 3 and a signaling apparatus.

The measuring apparatus 432 is configured to measure a differential current between a first electric current in the electrical forward conductor, which forward-conducts from the control apparatus 320 for controlling the electrical load 340 to the electrical load 340, more precisely in the control-apparatus-side section 362 of the forward conductor, and a second electric current in the electrical reverse conductor 372, 374, which conducts away from the electrical load 340. In this case, the differential current can be produced by the test residual current, which is generated by the residual-current-generating apparatus of the residual current sensor 330, and/or by the residual current 442 based on an actual fault, for example in the electrical load 340 or the heated component 440.

The signaling apparatus of the residual current sensor 330 is configured to signal the test residual current and/or the residual current 442 to the control apparatus 320 via the forward conductor, more precisely the control-apparatus-side section 362 of the forward conductor, depending on the comparison of the measured differential current with the threshold value.

The residual-current-generating apparatus and the signaling apparatus, which are omitted in FIG. 4 for reasons of space in the drawing, will be dealt with in more detail below and in particular with reference to FIG. 5.

In accordance with one exemplary embodiment, the signaling apparatus is configured to signal the residual current 442 and/or the test residual current to the control apparatus 320 by using current amplitude modulation on the forward conductor, in particular on the control-apparatus-side section 362 of the forward conductor. In accordance with another exemplary embodiment, the signaling apparatus is configured to signal the residual current 442 and/or the test residual current to the control apparatus 320 by modulation of a high-frequency data signal on the forward conductor, in particular on the control-apparatus-side section 362 of the forward conductor.

In accordance with one exemplary embodiment, the electrical circuit 334 is configured to carry out the comparison of the measured differential current with a threshold value.

In accordance with the exemplary embodiment illustrated in FIG. 4, the control apparatus 320, which can also be referred to as a heater controller, has the current sensor 422, the output switch 424, the structure connections 426 and the supply connections 428. In this case, the current sensor 422 and the output switch 424 are connected to the control-apparatus-side section 362 of the forward conductor, which can also be referred to as a single-pole electrical connection. The current sensor 422 is configured to detect an electric current in the forward conductor. The output switch 424 is configured to interrupt a flow of electric current in the forward conductor. The control apparatus 320 also has an output connection for connection to the control-apparatus-side section 362 of the forward conductor. In this case, the current sensor 422 is electrically connected between the output switch 424 and the output connection. The control apparatus 320 can be connected to the structure-side section of the reverse conductor or directly to the structure element by means of the structure connections 426. At least one of the structure connections 426 here represents an input connection for connection to the further structure-side section of the reverse conductor or directly to the structure element. A voltage can be applied to the forward conductor and the reverse conductor by means of the supply connections 428. In other words, a system comprising the residual current protective device 310 and the heated component 440 having the electrical load 340 can be supplied with electrical power or can be connected to an electrical power source by means of the supply connections 428. In accordance with the exemplary embodiment illustrated in FIG. 4, even though it is not explicitly illustrated in FIG. 4, the control apparatus 320 has an electrical evaluation circuit for evaluating the residual current 442 signaled by the residual current sensor 330. In addition or alternatively, the control apparatus 320 has a reception circuit for receiving the residual current 442 signaled by the residual current sensor 330.

The heated component 440 has the electrical load 340 or heater 340 and the component structure connection 444. The component structure connection 444 serves for grounding the heated component 440, for example. The heated component 440 can be connected to a vehicle structure or the structure element of the vehicle by means of the component structure connection 444.

The structure-side section 374 of the reverse conductor can be connected to the structure element of the vehicle by means of the reverse conductor structure connection 474. In this case, the reverse conductor structure connection 474 can optionally also be part of the residual current sensor 330. In this case, the structure-side section 374 of the reverse conductor and at least one of the structure connections 426 of the control apparatus 320 can be or are electrically conductively connected to one another by means of the structure element of the vehicle.

In accordance with the exemplary embodiment illustrated here, the control apparatus 320 and the residual current sensor 330 are housed separately from one another, even though this is not explicitly illustrated in FIG. 4. In other words, the control apparatus 320 has a first housing and the residual current sensor 330 has a separate second housing, which housings are arranged at a distance or separated from one another. In accordance with the exemplary embodiment illustrated in FIG. 4, the control-apparatus-side section 362 of the forward conductor is also at least as long as the load-side section 364 of the forward conductor. In this case, a length of the control-apparatus-side section 362 of the forward conductor can be merely approximately 1 meter, for example.

In summary, the residual current sensor 330, which is associated with the control apparatus 320, for example a heating controller 320, but is arranged remotely from said control apparatus and close to the electrical load 340 to be monitored, generally an electrical heater, is configured, inter alia, to monitor the one load current in the forward and the reverse conductor to said electrical load 340 for the occurrence of a differential current. The residual current sensor 330 is supplied with electrical power from the forward conductor, which is embodied, for example, as a single-pole electrical connection, to the load 340 to be monitored. If a differential current is identified between the forward and the reverse conductor, the residual current sensor 330 manipulates the current flowing in the forward conductor in such a way that the upstream control apparatus 320 identifies a fault in the electrical load 340 and can switch off said load.

In other words, by using the residual current protective device 310, the electrical load 340 and/or the heated component 440 can be monitored for the occurrence of a residual current 442 through the already present heater controller 320 in connection with a residual current sensor 330 belonging to the heater controller 320 but physically remote therefrom. The residual current sensor 330 is placed directly on the heated component 440 that is to be monitored, for example, and the forward conductor and the reverse conductor to the heated component 440 are guided through the residual current sensor 330. By comparing the outgoing and returning current in the forward and reverse conductors or component connections, a residual current can therefore be indirectly identified in the residual current sensor 330, said residual current can be evaluated in the electrical circuit 334 or electronics 334 and, from a specific residual current value, for example 30 milliamps or the like, feedback can be emitted to the control apparatus 320 or the heater controller 320. In the form of the evaluation apparatus, the control apparatus 320 has a technical apparatus configured to evaluate such feedback and consequently to disconnect the heated component 440 by means of a mechanical or electronic output switch 424, for example permanently, in a single-pole manner. An energy supply of the residual current sensor 330 that is remote from the heater controller 320 is or can be diverted from a supply voltage of the heated component 440 that is to be monitored. Not only the feedback from the residual current sensor 330 to the heater controller 320 but also the transmission of the test signal from the heater controller 320 to the residual current sensor 330 is effected via the forward conductor or a supply voltage line for the heated component 440 such that, in particular, no additional electrical connections are required. The residual current sensor 330 signals an identified present residual current 442 to the heater controller 320 via the forward conductor or the supply line preferably by changing a current amplitude. Such a change or change in current can be detected by an output current sensor already arranged in the heater controller 320 and can be evaluated in order to disconnect the heated component 440.

Figure 5:
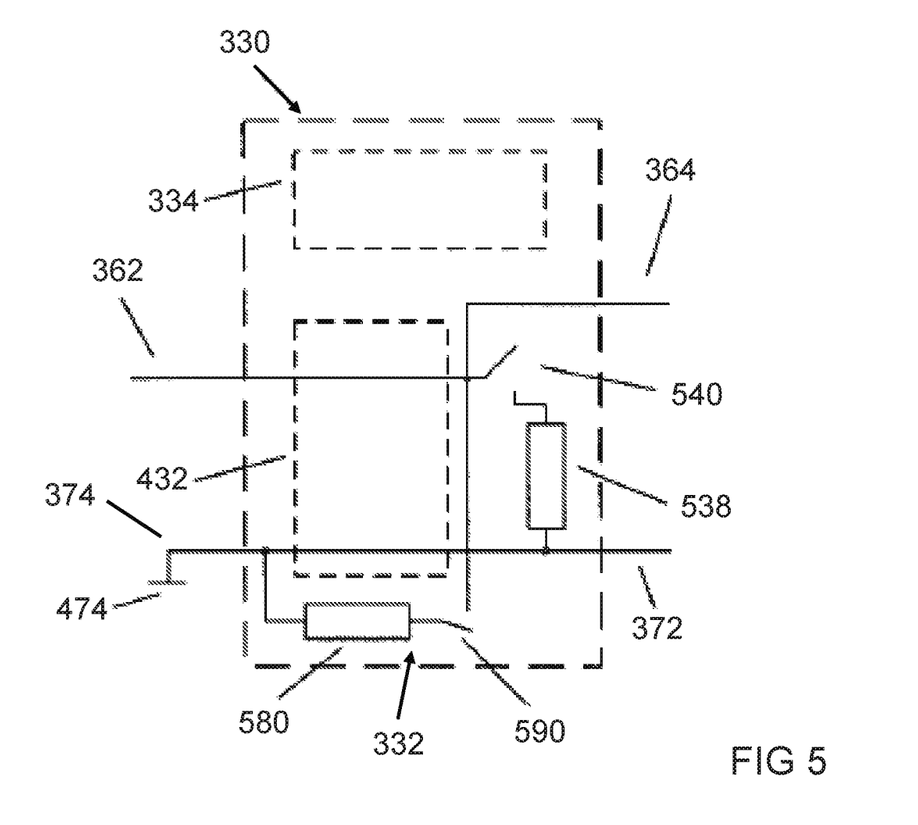
FIG. 5 shows a schematic illustration of a residual current sensor for a residual current protective device in accordance with an exemplary embodiment.

FIG. 5 shows a schematic illustration of a residual current sensor 330 for a residual current protective device in accordance with an exemplary embodiment. In this case, the residual current sensor 330 is the residual current sensor of the residual current protective device from FIG. 4 or a similar residual current sensor, wherein the residual-current-generating apparatus and an embodiment variant of the signaling apparatus of the residual current sensor 330 are illustrated in more detail in FIG. 5.

FIG. 5 illustrates the residual current sensor 330 having the residual-current-generating apparatus 332, the electrical circuit 334 and the measuring apparatus 432, the control-apparatus-side section 362 of the forward conductor, the load-side section 364 of the forward conductor, the load-side section 372 of the reverse conductor, the structure-side section 374 of the reverse conductor, the reverse conductor structure connection 474, furthermore a defined load 538 and a load connection switch 540 or switch 540 for the purpose of connecting the load of the signaling apparatus of the residual current sensor 330 and also, finally, an electrical resistor 580 and a residual current switch 590 of the residual-current-generating apparatus 332.

The residual current sensor 330 therefore has the residual-current-generating apparatus 332, which has the electrical resistor 580 and the residual current switch 590, the electrical circuit 334, the measuring apparatus 432 and the signaling apparatus, which has the load connection switch 540 and the defined load 538.

The residual-current-generating apparatus 332 has the electrical resistor 580 and the residual current switch 590. The residual current switch 590 is configured to connect the electrical resistor 580 for the purpose of generating the test residual current. The electrical resistor 580 is electrically conductively connected to the reverse conductor 372, 374. The residual current switch 590 is configured, in a closed switching position, to electrically conductively connect the electrical resistor 580 to the forward conductor 362, 364. The test residual current can be generated in this way.

The signaling apparatus of the residual current sensor 330 has the load connection switch 540 and the defined load 538. The defined load 538 is electrically connected to the reverse conductor or connected between a connection of the load connection switch 540 and the reverse conductor. The load connection switch 540 is configured, in a closed switching position, to connect the defined load 538 to the forward conductor 362, 364.

To signal a residual current and/or a test residual current, a change in current, for example, is generated in the residual current sensor 330 by means of the load connection switch 540, which can be embodied as a mechanical or electronic switch, by virtue of the fact that the defined load 538 arranged in the residual current sensor 330 is connected.

In other words, the electrical circuit 334 or additional circuit or electronics 334 arranged in the residual current sensor 330 is configured to monitor a voltage on the forward conductor 362, 364 of the electrical load to be monitored for the test signal in the form of a defined modulation, which is generated by the upstream control apparatus. This constitutes an additional function within the electrical circuit 334. If such a supply voltage modulation is identified as a test signal, the residual current sensor 330 generates a test residual current by way of an internal additional circuit in the form of the residual-current-generating apparatus 332, the measuring apparatus 432 in turn identifying said test residual current as a differential current. The load current is subsequently, thus also in the case of the test residual current, manipulated by the signaling apparatus of the residual current sensor 330 in such a way that the upstream control apparatus identifies this as a fault signal by way of the residual current sensor 330. The functionality of the residual current sensor 330 can be established in this way by a self-test launched from the outside.

In accordance with an exemplary embodiment, the residual current sensor 330 has a forward conductor input connection for connection to the control-apparatus-side section 362 of the forward conductor, a forward conductor output connection for connection to the load-side section 364 of the forward conductor, a reverse conductor input connection for connection to the load-side section 372 of the reverse conductor and a reverse conductor output connection for connection to the structure-side section 374 of the reverse conductor.

Figure 6:
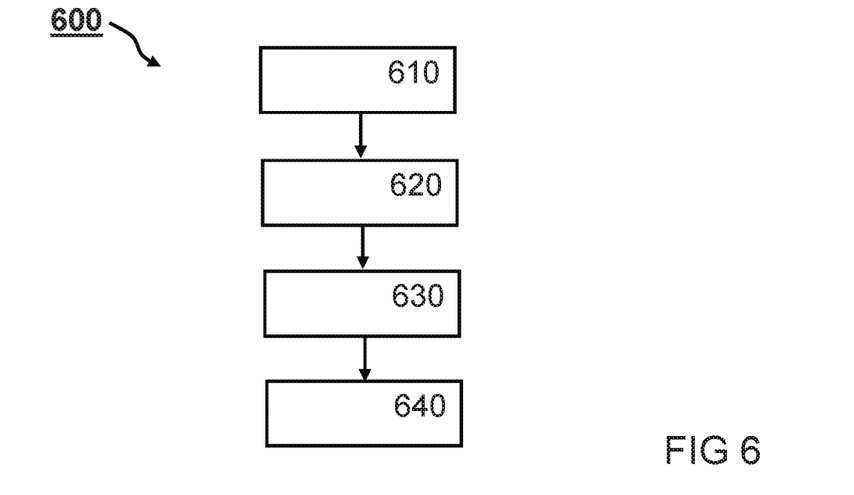
FIG. 6 shows a flow chart of a method in accordance with an exemplary embodiment.

FIG. 6 shows a flow chart of a method 600 for performing a self-test of a residual current sensor in accordance with an exemplary embodiment. The method 600 can be executed to perform a self-test of a residual current sensor for a residual current protective device for monitoring an electrical load for a vehicle or to effect the performance thereof. In this case, the method 600 for performing a self-test of a residual current sensor can be executed in connection with or using the residual current sensor from one of FIGS. 3 to 5 or a similar residual current sensor or in connection with or using a residual current protective device from one of FIGS. 3 to 4 or a similar residual current protective device.

The method 600 for performing a self-test of a residual current sensor has a step 610 of identifying a test signal in an electrical forward conductor, which forward-conducts from a control apparatus for controlling the electrical load to the electrical load. The test signal represents a request to perform a self-test of the residual current sensor. In a subsequent generation step 620, a test residual current is generated in an electrical reverse conductor, which conducts away from the electrical load, in response to the identified test signal.

Next, in a measurement step 630, a differential current between a first electric current in the electrical forward conductor and a second electric current in the electrical reverse conductor are measured. In a subsequent signaling step 640, at least the test residual current is signaled to the control apparatus via the forward conductor depending on a comparison of the measured differential current with a threshold value.

The method 600 for performing a self-test of a residual current sensor thus has the step 610 of identifying a test signal, the step 620 of generating a test residual current, the step 630 of measuring a differential current and the signaling step 640.

In accordance with one exemplary embodiment, in the method 600, between the measuring step 630 and the signaling step 640, a step of comparing the measured differential current with a threshold value can also be carried out in order to identify or determine the presence of a residual current.

The exemplary embodiments described and shown in the figures are selected purely by way of example. Different exemplary embodiments may be combined with one another in full or in relation to individual features. It is also possible to supplement an exemplary embodiment with features of a further exemplary embodiment. Furthermore, it is possible for method steps according to the invention to be repeated and to be carried out in a different sequence to that described.

If one exemplary embodiment comprises an "and/or" conjunction between a first feature and a second feature, this should be read as meaning that the exemplary embodiment, in accordance with one embodiment, has both the first feature and the second feature and, in accordance with a further embodiment, has either only the first feature or only the second feature.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A residual current sensor for a residual current protective device for monitoring an electrical load for a vehicle, the residual current sensor comprising:
an electrical circuit for identifying a test signal in an electrical forward conductor from a control apparatus for controlling the electrical load, the forward conductor being an electrical conductor that forward-conducts from the control apparatus to the electrical load, wherein the test signal represents a request to perform a self-test of the residual current sensor;
a residual-current-generating apparatus for generating a test residual current in a reverse conductor, the reverse conductor being connected to the electrical load and conducting away from the electrical load, the test residual current being generated in response to the identified test signal;
a measuring apparatus for measuring a differential current between a first electric current in the forward conductor and a second electric current in the reverse conductor; and
a signaling apparatus for signaling at least the test residual current back over the conductor to the control apparatus via the forward conductor depending on a comparison of the measured differential current with a threshold value.

2. The residual current sensor as claimed in claim 1, wherein the electrical circuit is configured to identify a modulation of a voltage on the forward conductor, the modulation generated by the control device as the test signal.

3. The residual current sensor as claimed in claim 1, wherein the residual-current-generating apparatus has a residual current switch for connecting an electrical resistor for residual current generation, wherein the electrical resistor is electrically conductively connected to the reverse conductor, wherein the residual current switch is configured, in a closed switching position, to electrically conductively connect the electrical resistor to the forward conductor.

4. The residual current sensor as claimed in claim 1, wherein the signaling apparatus is configured to signal the test residual current and/or a residual current produced by the electrical load to the control apparatus using current amplitude modulation on the forward conductor.

5. The residual current sensor as claimed in claim 1, wherein the signaling apparatus has a switch for connecting a defined load, wherein the defined load is electrically conductively connected to the reverse conductor, wherein the switch is configured, in a closed switching position, to electrically conductively connect the defined load to the forward conductor.

6. The residual current sensor as claimed in claim 1, wherein the electrical circuit is configured to carry out the comparison of the measured differential current with the threshold value.

7. A residual current protective device for monitoring the electrical load for a vehicle, the residual current protective device comprising:
the residual current sensor of claim 1; and
the control apparatus for controlling the electrical load, wherein the control apparatus and the residual current sensor are electrically conductively connected to one another in series at least via the forward conductor.

8. The residual current protective device as claimed in claim 7, wherein the control apparatus is configured to transmit the test signal to the residual current sensor via the forward conductor, the test signal being a modulation of a voltage.

9. The residual current protective device as claimed in claim 7, wherein the control apparatus and the residual current sensor are housed separately from one another.

10. The residual current protective device as claimed in claim 7, wherein the residual current sensor has a forward conductor input connection for connection to a control-apparatus-side section of the forward conductor, a forward conductor output connection for connection to a load-side section of the forward conductor, a reverse conductor input connection for connection to a load-side section of the reverse conductor and a reverse conductor output connection for connection to a structure-side section of the reverse conductor.

11. The residual current protective device as claimed in claim 10, wherein the control-apparatus-side section of the forward conductor is at least as long as the load-side section of the forward conductor.

12. The residual current protective device as claimed in claim 10, wherein the control apparatus has at least one output connection for connection to the control-apparatus-side section of the forward conductor and an input connection for connection to a further structure-side section of the reverse conductor, wherein the further structure-side section and the structure-side section of the reverse conductor can be or are electrically conductively connected to one another by means of a structure element of the vehicle.

13. The residual current sensor as claimed in claim 1, wherein the residual current sensor is connected in series between the control apparatus and the electrical load via the forward conductor and the reverse conductor.

14. A method for performing a self-test of a residual current sensor for a residual current protective device for monitoring an electrical load for a vehicle, the method comprising:

identifying a test signal from a control apparatus for controlling the electrical load in an electrical forward conductor that connects the control apparatus to the electrical load, wherein the test signal represents a request to perform a self-test of the residual current sensor;

generating a test residual current in an electrical reverse conductor connecting the residual current sensor to the electrical load, the electrical reverse conductor conducting away from the electrical load, in response to the identified test signal;

measuring a differential current between a first electric current in the electrical forward conductor and a second electric current in the electrical reverse conductor; and signaling back over the electrical forward conductor at least the test residual current to the control apparatus via the electrical forward conductor depending on a comparison of the measured differential current with a threshold value.

15. A computer program product having program code stored on a non-transitory machine-readable storage medium that when executed on a computer performs the method as claimed in claim 14.

* * * * *